(12) United States Patent
Jerominek et al.

(10) Patent No.: US 6,849,170 B2
(45) Date of Patent: Feb. 1, 2005

(54) PROCESS FOR MAKING MICRODEVICE WITH MOVABLE MICROPLATFORM

(75) Inventors: Hubert Jerominek, Sainte-Foy (CA); Patrice Topart, Cap-Rouge (CA)

(73) Assignee: Institut National D'Optique, Quebec (CA)

(*) Notice: Subject to any disclaimer, the term of this patent is extended or adjusted under 35 U.S.C. 154(b) by 0 days.

(21) Appl. No.: 10/353,185

(22) Filed: Jan. 27, 2003

(65) Prior Publication Data

US 2004/0144653 A1 Jul. 29, 2004

(51) Int. Cl.$^7$ ............................... C25D 1/06; C25D 1/00
(52) U.S. Cl. ............................. 205/71; 205/67; 205/78; 205/79; 205/122
(58) Field of Search .......................... 205/67, 71, 78, 205/79, 118, 122, 123, 128

(56) References Cited

U.S. PATENT DOCUMENTS

| | | | |
|---|---|---|---|
| 4,317,611 A | 3/1982 | Petersen | 350/6.6 |
| 5,083,857 A | 1/1992 | Hornbeck | 359/291 |
| 5,212,582 A | 5/1993 | Nelson | 359/224 |
| 5,233,456 A | 8/1993 | Nelson | 359/214 |
| 5,312,513 A | 5/1994 | Florence et al. | 156/643 |
| 5,789,264 A | 8/1998 | Chung | 437/40 |
| 6,025,951 A | 2/2000 | Swart et al. | 359/245 |
| 6,044,705 A | 4/2000 | Neukermans et al. | 73/504.02 |
| 6,323,834 B1 * | 11/2001 | Colgan et al. | 345/84 |
| 6,353,492 B2 | 3/2002 | McClelland et al. | 359/254 |
| 6,458,263 B1 * | 10/2002 | Morales et al. | 205/118 |
| 6,504,967 B1 * | 1/2003 | Zhou et al. | 385/18 |
| 2001/0044165 A1 | 11/2001 | Lee et al. | 438/52 |

OTHER PUBLICATIONS

Kim et al., "A high fill–factor micro–mirror stacked on a crossbar torsion spring for electrostatiscally–actuated two–axis operation in large–scale optical switch," 16th IEEE Internat'l Conf on MEMS, Jan. 19–23, 2003, pp. 259–262.*

Wagner et al., "Infrared micromirror array with large pixel size and large deflection angel," 1997 Internat'l Conf. on Solid State Sensors and Actuators, Jun. 16–19, 1997, pp. 75–78.*

Jeon et al., "Electrostatic digital micromirror using inter-digitated cantilevers," 15th IEEE Internat'l Conf. on MEMS, Jan. 20–24, 2002, pp. 528–531.*

Yoon et al., "Monolithic integration of 3–D electroplated microstructures with unlimited number of levels using planarization with sacrifical metallic mold (PSMM)," 12th IEEE Internat'l Conf. on MEMS, Jan. 17–21, 1999, pp. 624–629.*

* cited by examiner

*Primary Examiner*—Nam Nguyen
*Assistant Examiner*—Brian L Mutschler
(74) *Attorney, Agent, or Firm*—Merchant & Gould P.C.

(57) ABSTRACT

A process for making a microdevice that includes the steps of providing a base member and selectively electroforming a support member for supporting a microplatform with respect to the base member. The process also includes the steps of selectively electroforming the microplatform and forming a flexible hinge member for hingedly connecting the microplatform to the support member and allowing relative movement of the microplatform with respect to the support member. This microdevice, when compared to prior art devices, can have improved mechanical strength, rigidity, low deformation, and high planarity.

24 Claims, 12 Drawing Sheets

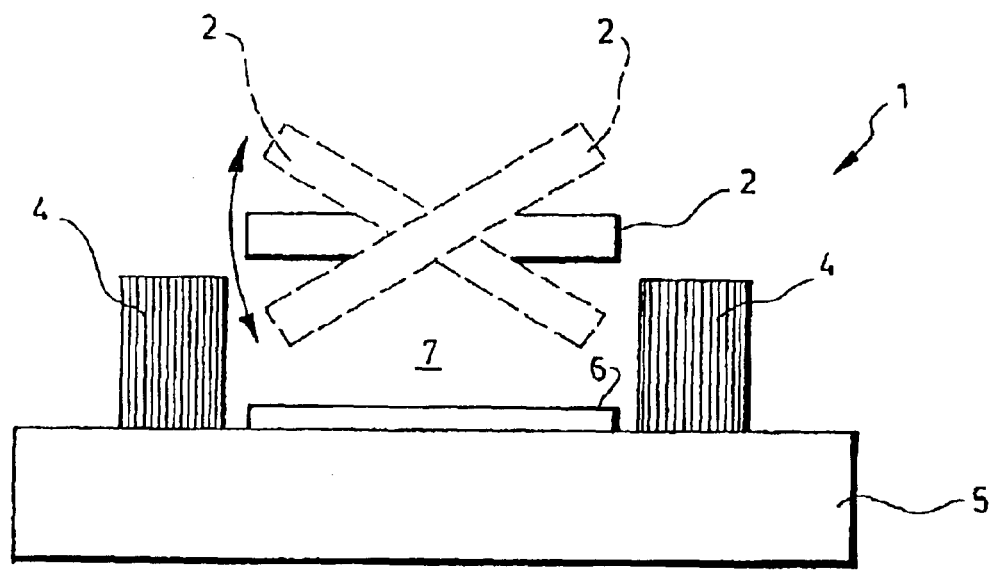
FIG. 1A
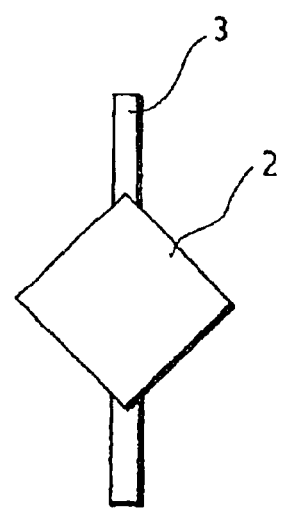
FIG. 1A1
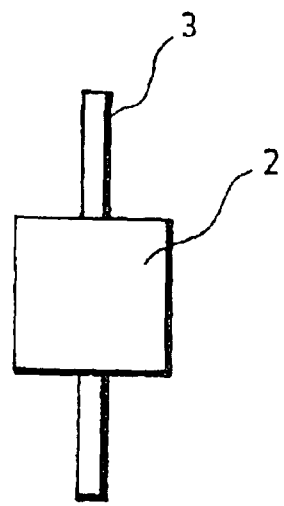
FIG. 1A2

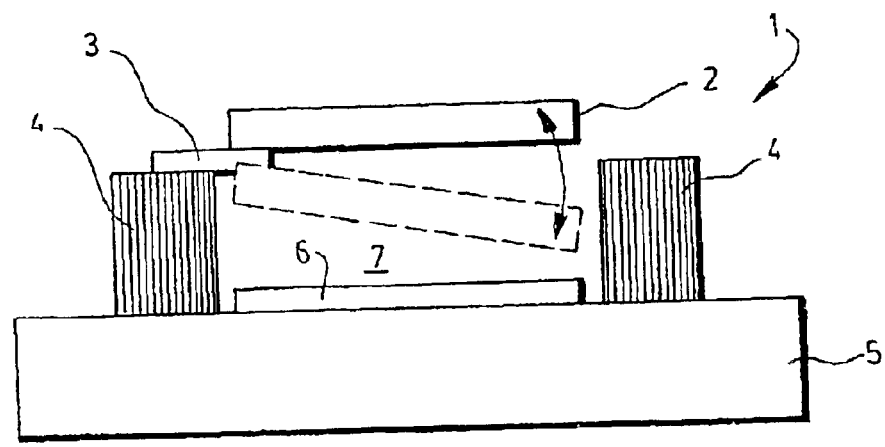
FIG. 1B
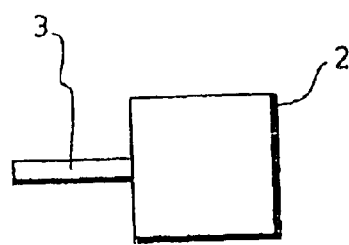
FIG. 1B1
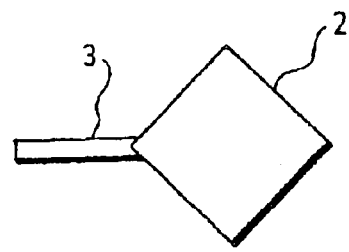
FIG. 1B2
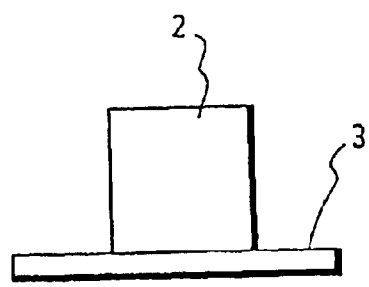
FIG. 1B3

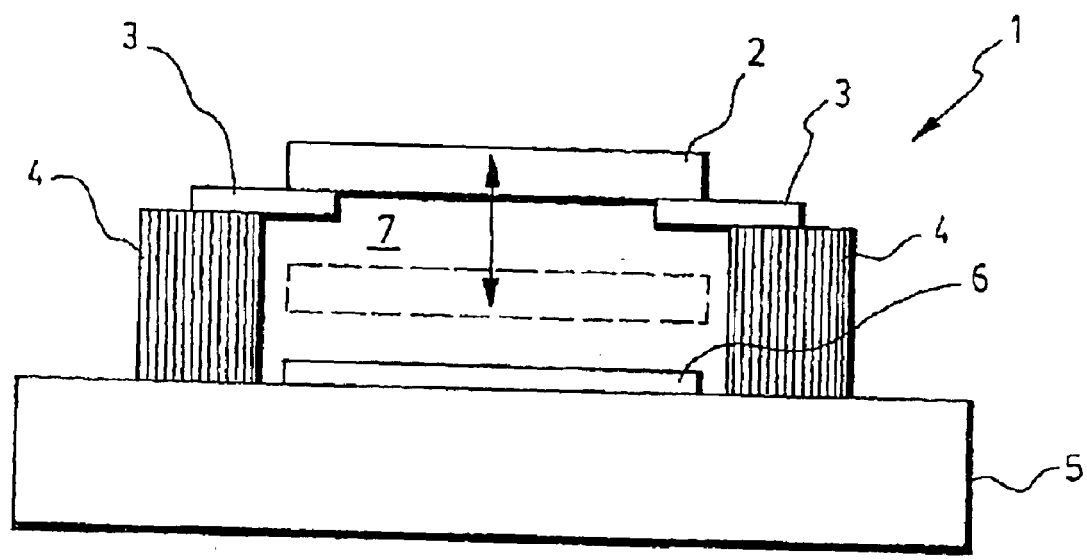
FIG. 1C
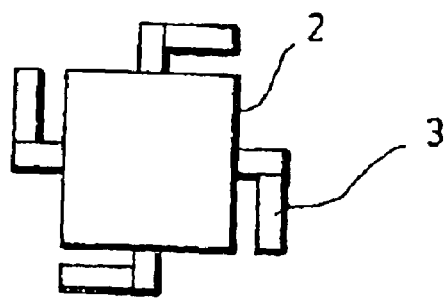
FIG. 1C1

PROCESS FOR MAKING MICRODEVICE WITH MOVABLE MICROPLATFORM

FIELD OF THE INVENTION

The present invention relates to a microdevice and a process for making thereof, but more particularly, to a microdevice equipped with a movable microplatform and a process for making thereof.

BACKGROUND OF THE INVENTION

There are several examples of miniature electromechanical devices equipped with movable microplatforms with lateral dimensions from a few micrometers to several thousands of micrometers. The pivoting along one or multiple axis, and vertical or horizontal displacement of these microplatforms is possible due to various types of hinge members including torsional and flexure hinge types. The movement of the microplatforms is induced typically via electrostatic, magnetic or thermal mechanisms.

The functions performed by these microdevices equipped with movable microplatforms include phase and amplitude modulation of visible, UV or IR radiation beams as well as mechanical protection with open and close functions of specialty microsystems. In particular, the microdevices used for radiation beam manipulation are often called micromirror devices and find multiple applications in telecom for laser beam attenuation and switching as well as in projection imagers as the spatial light modulators.

In optical applications in particular, it is extremely important to provide movable microplatforms that are free of mechanical deformations and defects, with a residual radius of curvature of many meters and surface roughness better than $\lambda/10$, where $\lambda$ is the wavelength of radiation used.

There are typically two methods used for manufacturing individual and arrays of microdevices equipped with movable microplatforms. The first most commonly used method makes use of a thin film technology developed for manufacturing integrated circuits (ICs), while the second method typically involves micromachining silicon wafers and epitaxial silicon films by a deep etching technique.

Known in the art is U.S. Pat. No. 6,025,951 by N. R. Swart et al, which discloses a micromirror device equipped with a flexure hinge permitting to tilt as well as to displace vertically a microplatform via the electrostatic interaction. Methods for forming individual or multiple microdevices are also described. These methods make use of the thin film technology developed for manufacturing ICs.

The biggest drawback of the microplatforms produced by the thin film technology is a residual stress in the deposited thin films as well as a mismatch between stresses in films made of different materials. This produces deviations from the platform flatness required and thus adversely affects the microdevice performance. Typically, the residual stress in thin films scales inversely with the film thickness. However, the thin film technology yields a film with a thickness not exceeding a few micrometers and thus the stress reduction is not sufficient. Thin films also have rough surfaces, which contributes to unwanted scattering of radiation illuminating the microplatform.

Also known in the art is U.S. Pat. No. 4,317,611 by K. E. Petersen, which discloses a torsional-type optical ray deflection apparatus produced out of a pair of etched plates, one of which is single crystal semiconductor material such as silicon, and the other is a suitable insulating material such as glass. A pivoting microplatform equipped with torsional hinges is made by anisotropic etching through a silicon wafer. It is then bonded to a glass plate equipped with suitable metal electrodes for electrostatic activation of the microplatform.

Also known in the art is U.S. Pat. No. 6,044,705 by A. P. Neukermans et al, which discloses a different approach to manufacturing of pivoting microplatform devices making use of a stress-free semiconductor layer of silicon. The epitaxial silicon layer with a thickness ranging from less than one to tens of micrometers is grown on the etch stop layer deposited on the Si wafer.

Also known in the art, there are U.S. Patent Application 2001/0044165 A1 by S. B. Lee et al. and U.S. Pat. No. 6,353,492 B2 by R. W. McClelland, which disclose pivoting microplatform devices made entirely from monocrystalline silicon wafers by the deep etching technique.

Application of silicon in the form of polished wafers or epitaxial layers deposited on silicon wafers allows to alleviate some limitations associated with the thin film technology. Silicon in this form is light, strong and stiff, yielding rigid microplatforms with low moment of inertia. It also yields a wide range of microplatform thicknesses from tens to hundreds of micrometers. Silicon wafers can be polished to provide excellent surface quality (i.e. very low roughness) and flatness. They will reflect radiation effectively when covered with appropriate coatings. On the other hand, patterning of silicon wafers may be a limiting factor in terms of minimum feature size or geometrical form especially if the anisotropic wet etching technique is applied. Moreover, the microdevices equipped with movable monocrystalline silicon microplatforms are typically of hybrid construction. They consist of at least two different parts, one comprising the microplatform and the other one performing a function of the supporting base equipped with electrodes and contact pads for actuation of the microplatform. Fully monolithic devices are difficult to implement and are mostly formed by the competing thin film technology.

The following United States Patents disclose other devices suffering from the same drawbacks as described above: U.S. Pat. No. 5,083,857 (L. J. Hornbeck); U.S. Pat. No. 5,212,582 (W. E. Nelson); U.S. Pat. No. 5,233,456 (W. E. Nelson); U.S. Pat. No. 5,312,513 (J. M. Florence et al.); and U.S. Pat. No. 5,789,264 (J. H. Chung).

SUMMARY OF THE INVENTION

An object of the present invention is to provide a process for making a microdevice equipped with a movable microplatform that overcomes the above-identified drawbacks of the prior art devices. In particular, a preferred microdevice according to the present invention can have improved mechanical strength, rigidity, low deformation, and high planarity. The microdevice may also be fully monolithic.

According to the present invention, there is provided a process for making a microdevice, comprising the steps of:
  a) providing a base member;
  b) selectively electroforming at least one support member for supporting a microplatform with respect to the base member;
  c) selectively electroforming the microplatform; and
  d) forming at least one flexible hinge member for hingedly connecting the microplatform to said at least one support member and allowing relative movement of the microplatform with respect to said at least one support member.

According to another aspect of the present invention, there is provided a microdevice comprising:

a base member;

at least one support member mountably connected to the base member, said at least one support member being selectively electroformed according to a selective electroforming process;

at least one hinge member mountably connected to said at least one support member; and a microplatform hingedly connected to said at least one hinge member for allowing relative movement of the microplatform with respect to said at least one support member, the microplatform being selectively electroformed according to a selective electroforming process.

Other objects, advantages and features of the present invention will become more apparent upon reading of the following non-restrictive description of preferred embodiments thereof, given by way of example only with reference to the accompanying drawings.

BRIEF DESCRIPTION OF THE DRAWINGS

FIG. 1A is a side section view along line A–A' of a microdevice shown in FIG. 2, according to a preferred embodiment of the present invention.

FIG. 1A1 is a top view of a microplatform with hinge members attached thereto, of the microdevice shown in FIG. 2, according to a preferred embodiment of the present invention.

FIG. 1A2 is top view of a microplatform with hinge members of a microdevice according to another preferred embodiment of the present invention.

FIG. 1B is a side section view similar to the one shown in FIG. 1A, of a microdevice according to another preferred embodiment of the present invention.

FIGS. 1B1, 1B2 and 1B3 are top views of microplatforms with hinge members attached thereto according to different preferred embodiments of the present invention.

FIG. 1C is a side section view similar to those shown in FIGS. 1A and 1B, of a microdevice according to another preferred embodiment of the present invention.

FIG. 1C1 is a top view of the microplatform and hinge members shown in FIG. 1C.

FIG. 2 is a perspective view of the microdevice shown in FIG. 1A.

DETAILED DESCRIPTION OF THE INVENTION

Figure 2:
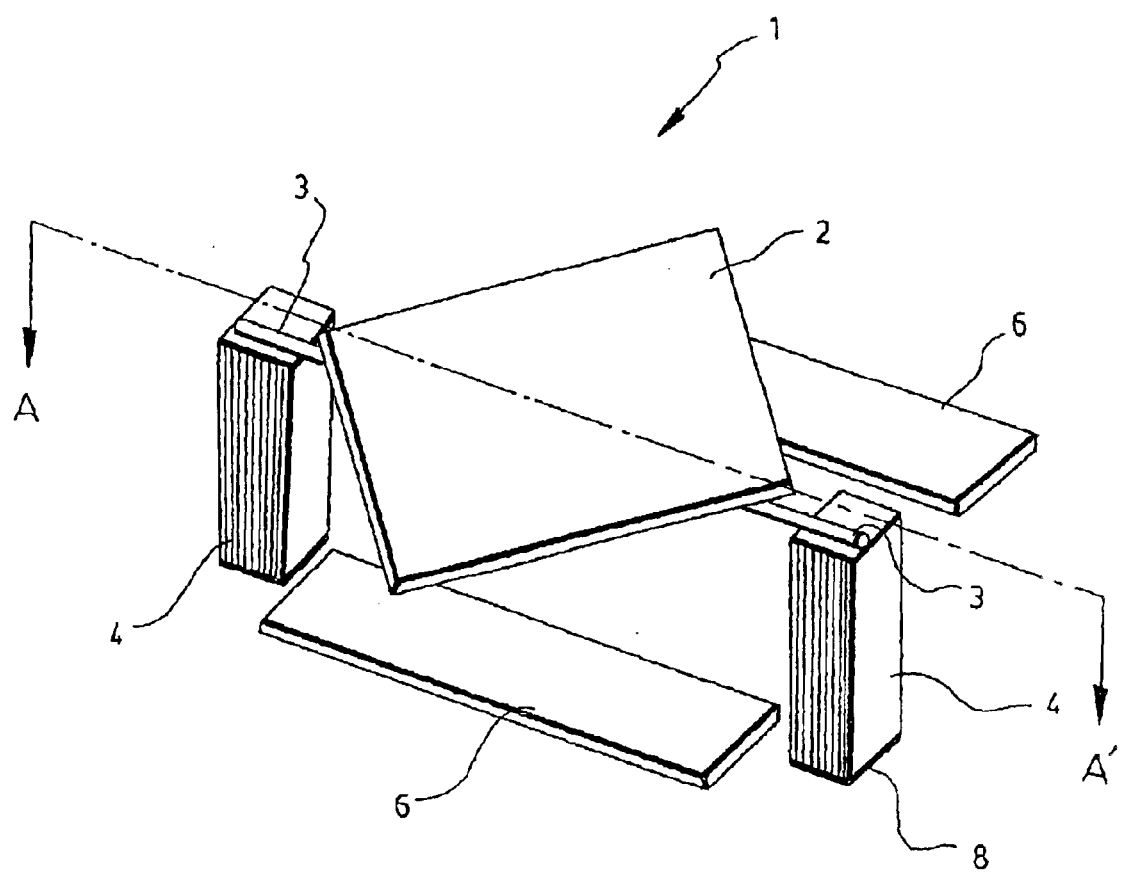

Referring to FIGS. 1A, 1B, 1C and 2, there are shown different types of preferred embodiments of microdevices 1 according to the present invention. Each of the illustrated microdevices 1 includes a base member and at least one support member 4 mountably connected to the base member. As will be explained below, the support member 4 is selectively electroformed according to a selective electroforming process and there are typically two support members 4 that are mounted on the base member. The microdevice 1 also includes at least one hinge member 3 mountably connected to the support member 4 and a microplatform 2 hingedly connected to the hinge member 3 for allowing relative movement of the microplatform 2 with respect to the support member 4. The microplatform 2 is also selectively electroformed according to a selective electroforming process.

Referring to FIGS. 3A to 4L, there is also illustrated a process for making the above microdevice 1. The process essentially involves the steps of:

a) providing a base member;

b) selectively electroforming at least one support member 4 for supporting a microplatform 2 with respect to the base member;

c) selectively electroforming the microplatform 2; and d) forming at least one flexible hinge member 3 for hingedly connecting the microplatform 2 to the at least one support member 4 and allowing relative movement of the microplatform 2 with respect to the at least one support member 4.

Referring now to FIGS. 3A to 3L, the process according to the present invention is preferably realized according to a first embodiment, wherein:

step b) comprises the step of mountably connecting the at least one support member 4 to the base member;

step d) is performed after step b) and before step c) and comprises the step of mountably connecting the at least one hinge member 3 to the at least one support member 4; and step c) comprises the step of mountably connecting the microplatform 2 to the at least one hinge member 3.

Referring to now FIGS. 4A to 4L, the process according to the present invention is preferably realized according to a second alternate embodiment, wherein:

step c) is performed before steps a), b) and d) and comprises the step of selectively electroforming the microplatform 2 on a sacrificial substrate 20;

step d) is performed before steps a) and b) and comprises the step of mountably connecting the at least one hinge member 3 to the microplatform 2;

step b) is performed before step a) and comprises the steps of mountably connecting the at least one support member 4 to the at least one hinge member 3 and removing the sacrificial substrate 20; and step a) comprises the step of mountably connecting the at least one support member 4 to the base member.

The above first and second preferred processes will be explained in more details herein below. Of course, several modifications may be effected thereto as those skilled in the art will understand.

As explained above, the process according the present invention is based on the selective electroforming technique (i.e. localized electroforming), which makes use of photolithographically patterned photoresist layers as precise masks defining the regions on a given substrate where the materials are electrolytically deposited. Generally, electroforming, as opposed to other film deposition techniques such as thermal evaporation or sputtering, offers several advantages including: a broad range of deposited materials (principally pure metals, metal alloys and organoceramic dielectrics), near room temperature processing using relatively low-cost equipment and facilities, high deposition rate and film thickness range from below 1 μm to several hundred of micrometers, stress free films, and conformal or selective deposition with excellent shape fidelity.

The direct or pulse current electroforming allows a precise control of the material properties, including its composition, crystallographic structure, texture and grain size. Moreover, stacking of thin layers with different compositions can be obtained with relative ease. Typical list of electroformed materials include: Au, Cr, Cu, Ni, Zn, Ag, Fe, Ni-Fe, In, PbSn, and organoceramics.

Modern photoresist materials offer selective photopatterning capabilities with submicrometer resolution, and masking layer thicknesses from a fraction of 1 $\mu$m to over 100 $\mu$m. With respect to forming the microdevices 1 equipped with movable microplatforms 2, the fabrication processes according to the present invention offer a reliable manufacturing of mechanically solid supports for the microplatforms 2, as well as the manufacturing of these platforms with thicknesses up to tens and even hundreds of micrometers which guarantees their mechanical strength, rigidity, low deformation, and high planarity. This provides a unique opportunity for forming microdevices 1 with microplatforms 2 with lateral dimensions of hundreds or even thousands of micrometers and a wide range of tilt angles (up to 90°) and displacements (several micrometers). Moreover, the forming processes make possible the manufacturing of microdevices being integrated parts of semiconductor substrates equipped with integrated electronic circuits or microdevices which can be in a hybrid fashion attached via soldering, gluing etc. to other substrates made of glass, ceramic or semiconductor. This offers an enormous flexibility in designing functional devices optimized for particular applications and operational environment.

Referring now to FIGS. 1A to 2, there are schematically shown different typical embodiments of microdevices 1 equipped with movable microplatforms 2. FIG. 1A shows a microdevice 1 equipped with a pivoting microplatform 2 and torsion hinge members 3 (shown in FIGS. 1A1 and 1A2) supporting this microplatform 2. FIG. 1B shows a microdevice 1 equipped with the cantilever type microplatform 2 and flexure hinge members 3 (shown also in FIGS. 1B1, 1B2 and 1B3). FIG. 1C shows a microdevice 1 equipped with the piston-like microplatform 2 and flexure hinge members 3 (also shown in FIG. 1C1). FIG. 2 shows a perspective view of the microdevice illustrated in FIG. 1A and equipped with the pivoting microplatform 2. Each of the microdevices 1 shown in FIGS. 1A, 1B, 1C and 2 comprises the following basic parts: a movable microplatform 2, at least one hinge member 3 providing a suspension to the microplatform 2 as well as the restoring torque for its movement, at least one support member 4 providing a support to the microplatform 2 and the hinge members 3, and a base member. The base member includes a substrate 5 providing a base for the at least one electrode 6 and contact pad 8 placed on the substrate 5 and supplying the electrical field for the microdevices 1 making use of the electrostatic actuation. The microdevice 1 also has a cavity 7 separating the microplatform 2 from the substrate 5.

Referring to FIGS. 3A to 3L, there is illustrated a first preferred embodiment of a manufacturing process for making the monolithic microdevice 1 equipped with a movable microplatform 2 that is depicted in FIG. 2.

Figure 3A:
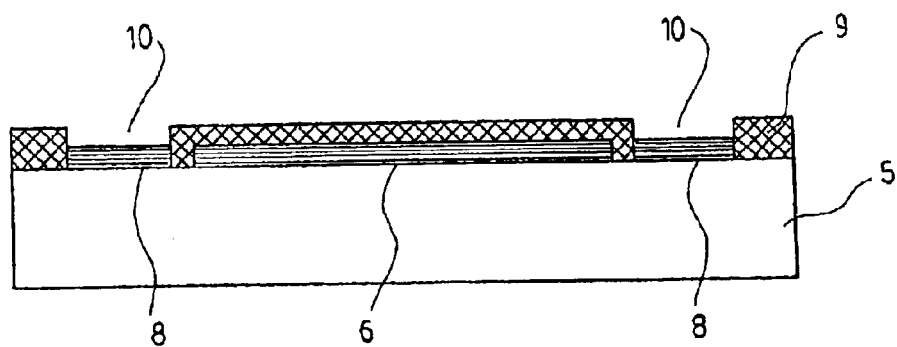
FIGS. 3A to 3L are side section views of various layers showing the steps involved in a first preferred process of making a microdevice, according to a preferred embodiment of the present invention.

FIG. 3A shows the microdevice substrate 5 equipped with electrodes 6 and metallic contact pads 8. This substrate 5 is typically a glass or ceramic plate or a semiconductor wafer equipped with an integrated electronic circuit for control and powering of the microdevice 1. This substrate 5 is covered with a thin (typically below 1 $\mu$m) protective layer 9 typically made of $SiO_2$ or $Si_3N_4$. Openings 10 are provided in the protective layer 9 for accessing the metallic (typically Al, Au) contact pads 8.

Figure 3B:
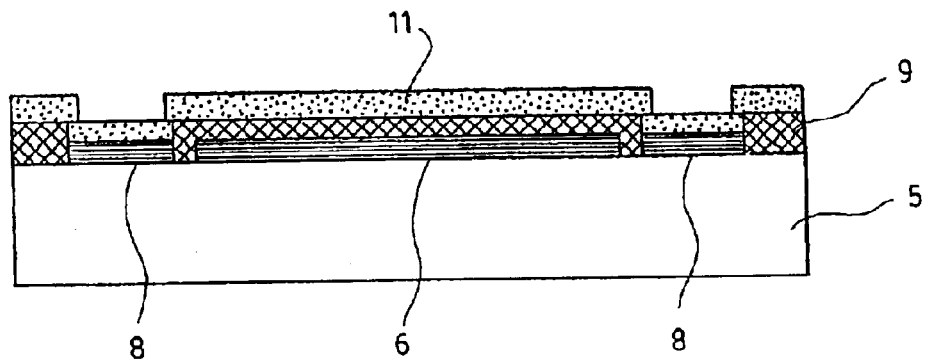

FIG. 3B shows the manufacturing step of covering the substrate 5 with a first metal seed layer 11. This seed layer 11 has typically a thickness of 0.1 to 0.15 $\mu$m and is made of metals such as Cu or Zn. This seed layer 11 is typically deposited by thermal evaporation, sputtering or electroforming. The seed layer 11 permits to apply electrical potential to the substrate 5 to start the electroforming process. Additional layers made of Ti or Cr with a thickness below 0.1 $\mu$m may also be used with the other materials as the adherence increasing layers.

Figure 3C:
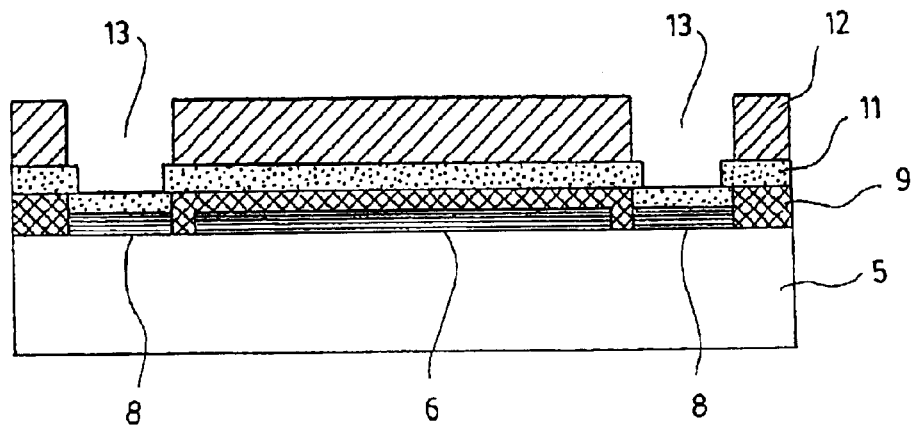

FIG. 3C shows the step of covering the substrate 5 with the first photoresist layer 12 and patterning of this layer 12 using the photolithographic technique. Various commercially available photoresist materials compatible with standard electroplating baths such as Shipley 1800 series, SU-8, AZ 4562 and BPR 100 can be used. Thickness of this photoresist layer 12 will define the height of cavity 7 underneath the microplatform 2, as shown in FIG. 2. This height may vary from 1 $\mu$m to hundreds of micrometers. In the photolithographic patterning process, openings 13 are produced in the first photoresist layer 12.

Figure 3D:
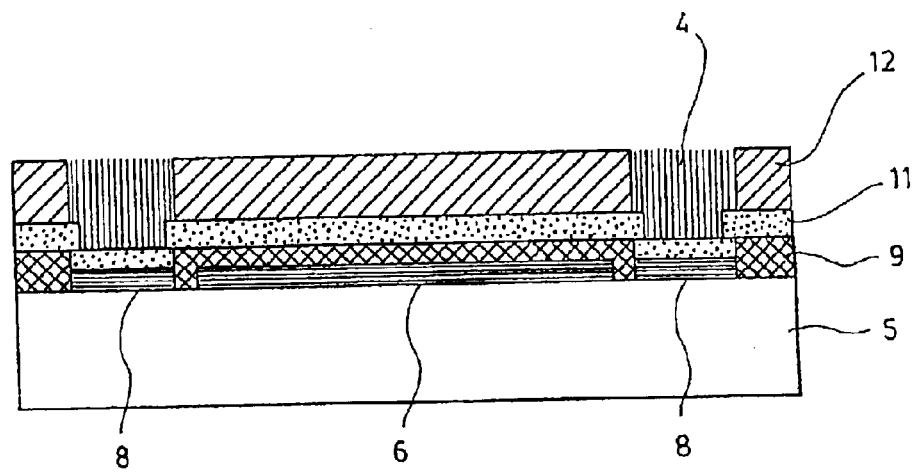

FIG. 3D illustrates the selective electroforming of the support members 4 in the openings 13 of the first photoresist layer 12. These support members 4 are in electrical contact with the contact pads 8 of the substrate 5. The preferred materials for the support members 4 are typically Ni and Ni—Fe alloys. Typically, low internal stress and very uniform Ni deposits can be obtained from nickel sulfamate baths continuously agitated and filtered to less than 3 $\mu$m. Commercial wafer electroplating stations, known in the art, equipped with stationary or rotating cathodes with proper baffle arrangements will allow to achieve such high quality nickel deposits. Typical applied currents, bath temperatures and pH levels are in the range 0.5–30 $Adm^{-2}$, 32–60° C. and 3.5–5 respectively.

In a typical selective electroforming operation, the substrate 5 or sacrificial substrate 20 are placed in a holder which allows electrical contact through the seed layers 11 or 21. This holder is then dipped in the electroplating bath so that the substrate faces the anode consisting of the metal to be plated or a platinized grid. A constant or pulsed current is then applied between the anode and stationary or rotating cathode so that the electrochemical reduction and consequently metal deposition can take place. The electroforming time is proportional to the thickness of deposited metal. The wafer is then rinsed and dried prior to subsequent processing steps.

Figure 3E:
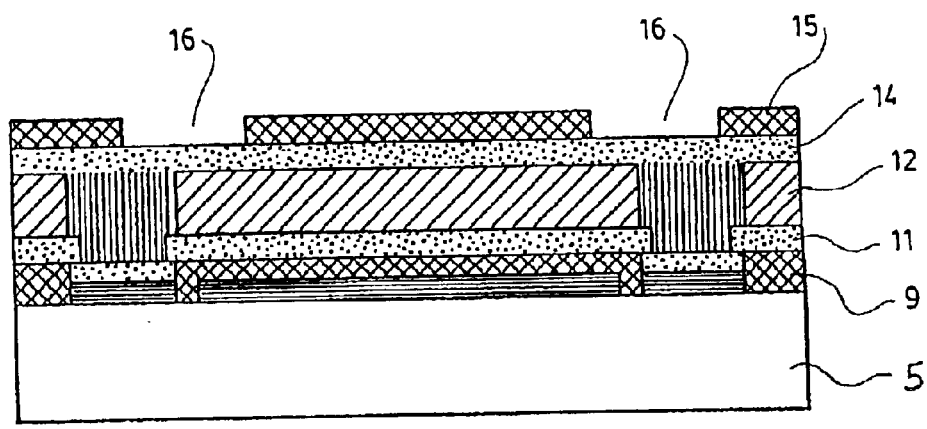

FIG. 3E shows deposition of a second metallic seed layer 14 similar to the first seed layer 11. The second seed layer 14 required for electroforming of the hinge members 3 material typically consist of the same material as the first seed layer 11, i.e. Cu, Zn or Al and it is deposited using the thermal evaporation and sputtering techniques. Its thickness is typically smaller than the thickness of the first seed layer 11, i.e. below 0.1 $\mu$m. FIG. 3E also shows deposition usually by a spin coating method of a second photoresist layer 15 and the photolithographic patterning of this second photoresist layer 15 in order to define the shape of the hinge members 3. Openings 16 in this second photoresist layer 15 down to the second seed layer 14 will permit electroforming of the hinge members 3.

Figure 3F:
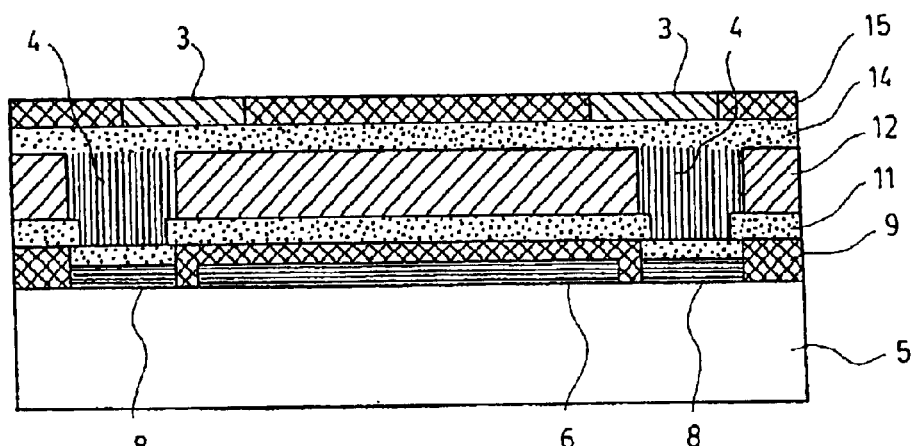

FIG. 3F shows the electroforming of the hinge members 3. The hinge members 3 are typically made of materials having low Young's modulus and high yield strength and relatively low stiffness such as Au in order to allow free movements of the microplatform attached to them. For electrolytic gold plating, commercial cyanide-containing formulations used in the microelectronics industry can be employed. Typical applied currents, bath temperatures and pH levels are in the range 0.05–0.3 Adm$^{-2}$, 43–60° C. and 5.5–7 respectively. It is preferable and most advantageous that the hinge members 3 be also selectively electroformed. However, those skilled in the art will understand that the hinge members may be formed by using other techniques such as the inorganic and organic thin film technology combined with the etching technique.

Figure 3G:
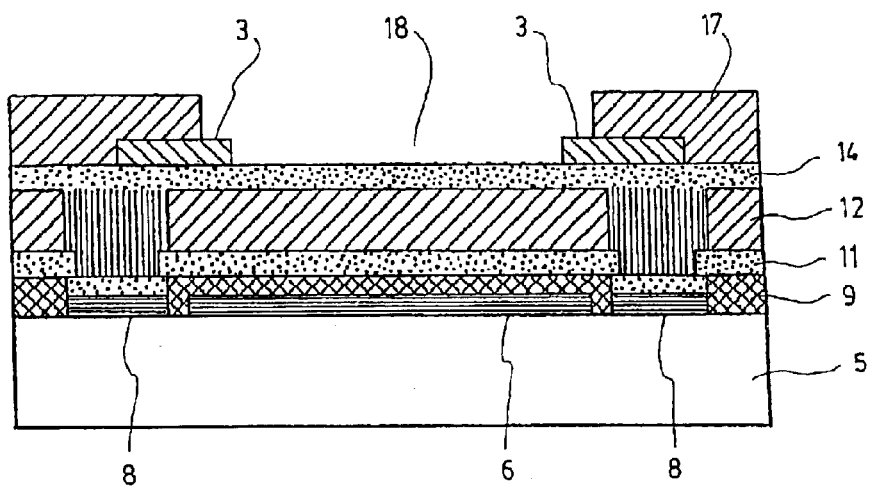

FIG. 3G shows removal of the second photoresist layer 15 and deposition and patterning of the third photoresist layer 17 which will be used as a mask for a selective electroforming of the microplatform 2. The second seed layer 14 protects the first photoresist layer 12 during removal, typically by stripping in a proper solution or by oxygen plasma ashing of the second photoresist layer 15. The opening 18 in the third photoresist layer 17 will define the shape of the microplatform 2 while the thickness of the third photoresist layer 17 will define the thickness of this microplatform 2.

Figure 3H:
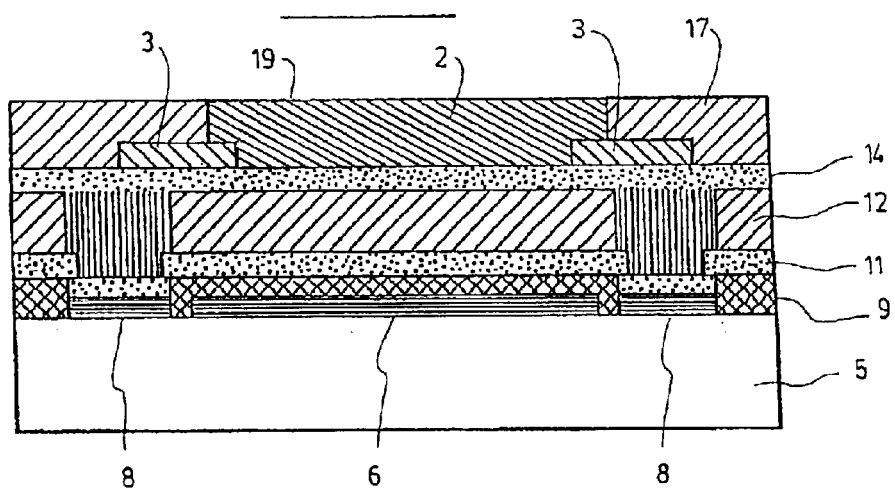

FIG. 3H shows the selective electroforming of the microplatform 2. This microplatform 2 has to be stiff in order to maintain an undeformed shape. Materials exhibiting high Young's modulus and low density such as Ni and Ni—Fe alloys are selected for manufacturing of the microplatform 2. Thickness of this microplatform 2 has to be properly selected taking into account its lateral dimensions and the requirements for undeformed shape and low residual stress as well as low surface roughness. This thickness may vary from few to several tens of micrometers, typically. The metallic microplatform 2 is in the electrical contact with the contact pads 8 via the conducting support members 4 and the hinge members 3. At this stage, a deposition and patterning of an additional highly reflective optical layer on the upper surface 19 of the microplatform 2 can optionally be performed (not shown in FIG. 3H). Moreover, manufacturing of an additional particular functional element such as a diffraction grating can also be performed at this stage.

Figure 3I:
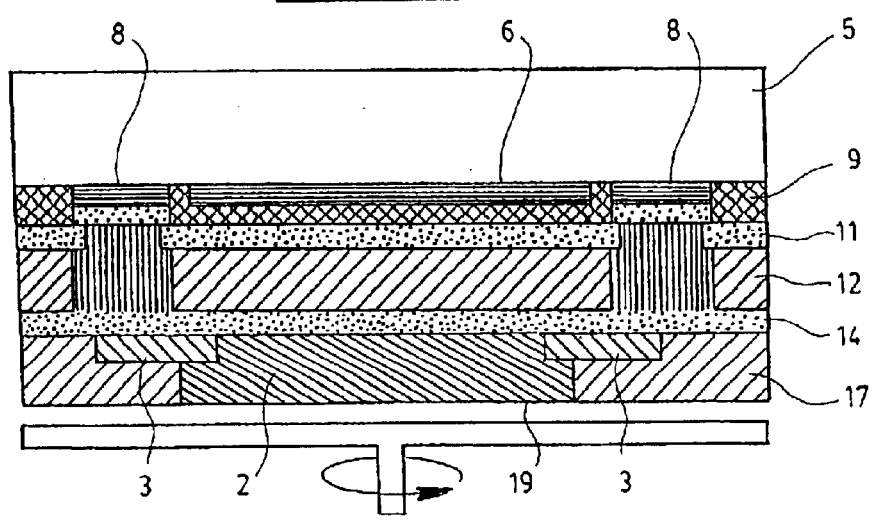

FIG. 3I shows an optional step of polishing the upper surface 19 of the microplatform 2 to reduce its rugosity and thus to increase its reflectivity of radiation. This manufacturing step may be necessary if very thick microplatforms are produced (over 50 μm) and the microdevice application requires efficient and low-loss reflection of electromagnetic radiation from the movable microplatform.

Figure 3J:
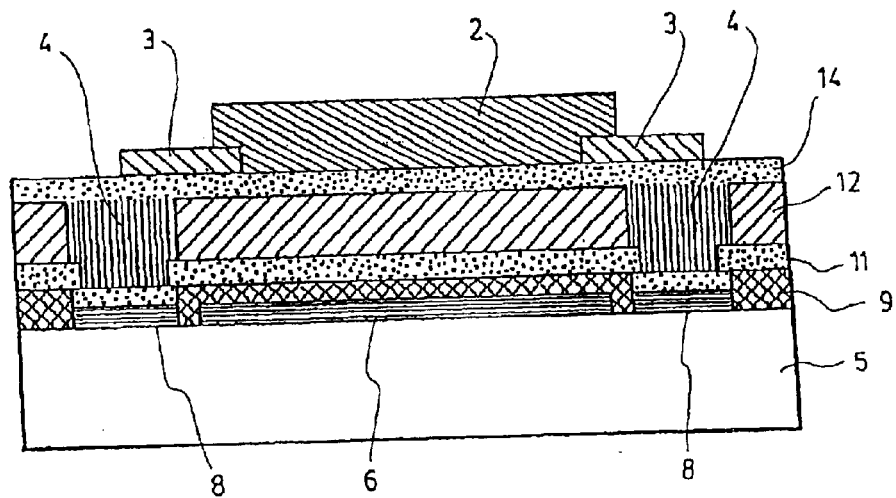

FIG. 3J shows the step of removal of the third photoresist layer 17 by the wet stripping or oxygen plasma ashing techniques.

Figure 3K:
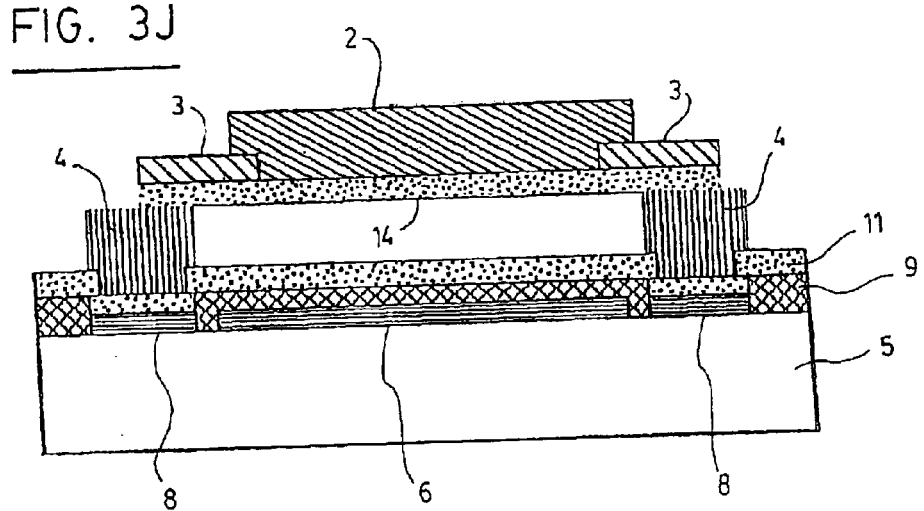

FIG. 3K shows the step of selective removal of part of the second seed layer 14 not protected by the hinge member 3 material and the microplatform 2 material. A wet isotropic etching is typically performed and the etching solution should not attack the materials of the hinge members 3 and the microplatform 2. FIG. 3K also shows, after removal of the second seed layer 14, the removal of the first photoresist layer 12. This processing step is carried out in a proper solution not attacking the other materials of the microdevice 1 or by the plasma ashing in the oxygen containing atmosphere.

Figure 3L:
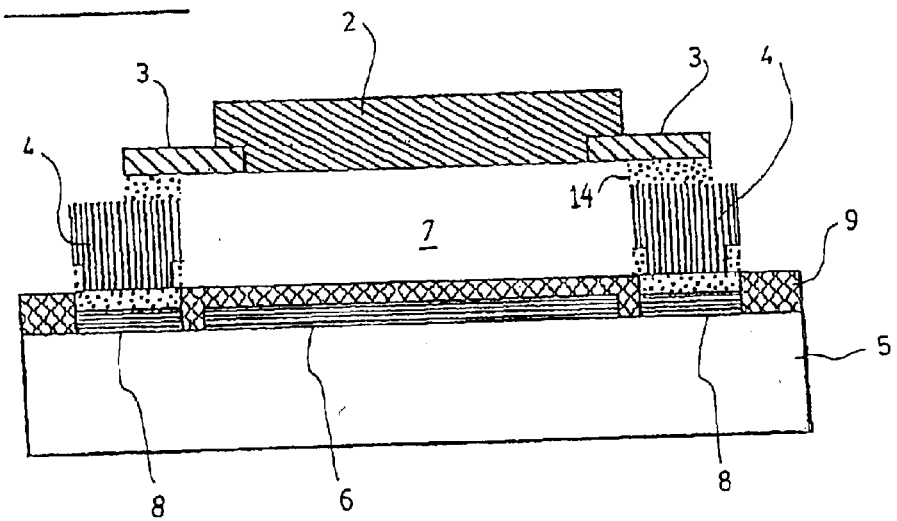

FIG. 3L shows the final step of removal of the first seed layer 11 from the surface of the substrate 5 as well as the residue of the second seed layer 14 from the microplatform 2 and the hinge members 3. This completes the liberation of the microplatform 2, the hinge member 3, and the support members 4. The etching solution for removal of the seed layers 11 and 14 should not attack other materials of the microdevice 1. This final step also fully defines the height of the cavity 7 below the microplatform 2 allowing a free movement of this microplatform 2 supported by the hinges 3 and the support members 4.

Referring to FIGS. 4A to 4L, there is shown a second preferred embodiment of a manufacturing process for making hybrid microdevices 1 equipped with movable microplatforms 2.

Figure 4A:
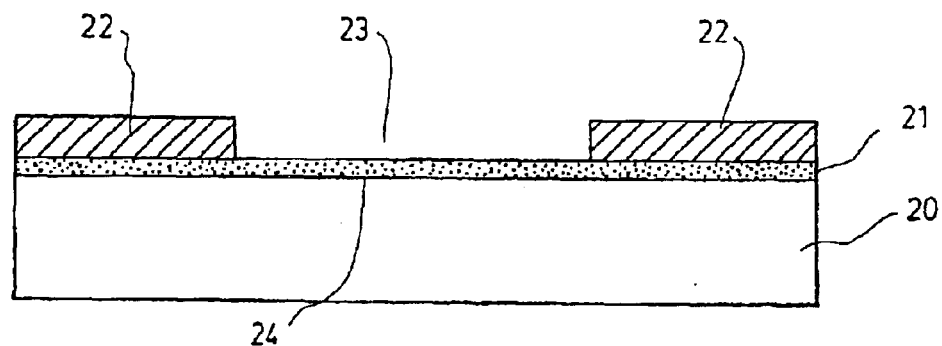
FIGS. 4A to 4L are side section views of various layers showing the steps involved in a second alternate process of making a microdevice according to a preferred embodiment of the present invention.

FIG. 4A shows a temporary or sacrificial substrate 20 covered with the first seed layer 21 and the first photoresist layer 22. The preferred materials for the sacrificial substrate 20 are glass and semiconductor wafers such as Si. The preferred materials for the first seed layer 21 are Cu. Zn, and Al layers typically having a thickness 0.1–0.5 μm. Additional layers made of Ti or Cr with a thickness below 0.1 μm may also be used with the other materials as the adherence increasing layers. All these layers are typically deposited by the thermal evaporation or sputtering techniques. The sacrificial substrate 20 is used to build a partial microdevice equipped with a movable microplatform 2 before transferring this partial microdevice and attaching it to a permanent substrate 5 so that it becomes the final microdevice 1. The first seed layer 21 is used to achieve the electroforming of the microplatform 2. It is also used as a sacrificial layer for attaching the partial microdevice during build-up to the temporary substrate 20. The first photoresist layer 22 is patterned to define the shape of the microplatform to be electroformed in the opening 23 in the first photoresist layer 22. Rugosity of the upper surface 24 of the temporary substrate 20 will define the surface quality of the microplatform 2 to be built on the temporary substrate 20. An optional step (not shown) of deposition and patterning of an additional highly reflective optical layer potentially having grating or other optical structures can be performed at this stage, on the first seed layer 21 and prior to deposition of the first photoresist layer 22.

Figure 4B:
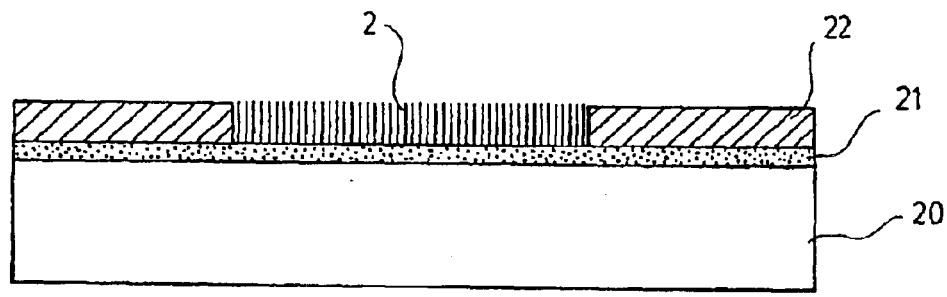

FIG. 4B shows the step of electroforming of the microplatform 2. This microplatform 2 may have the same specifications as the one described with reference to FIG. 3H.

Figure 4C:
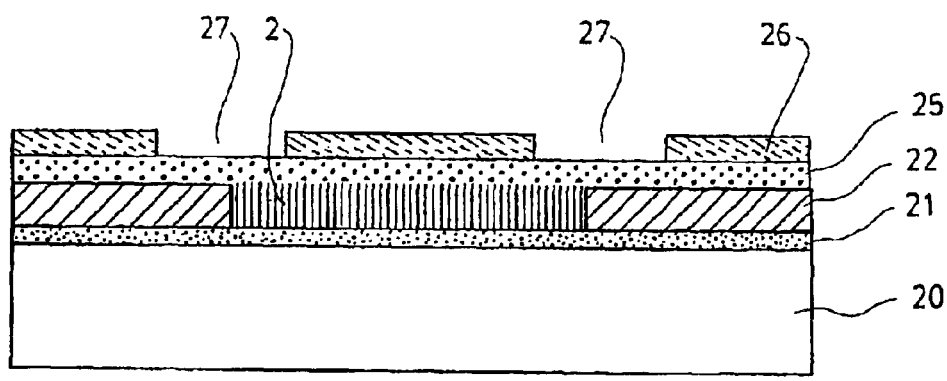

FIG. 4C shows the deposition of the second seed layer 25 as well as deposition and patterning of the second photoresist layer 26. The openings 27 in the second photoresist layer 26 will define the shape of hinge members.

Figure 4D:
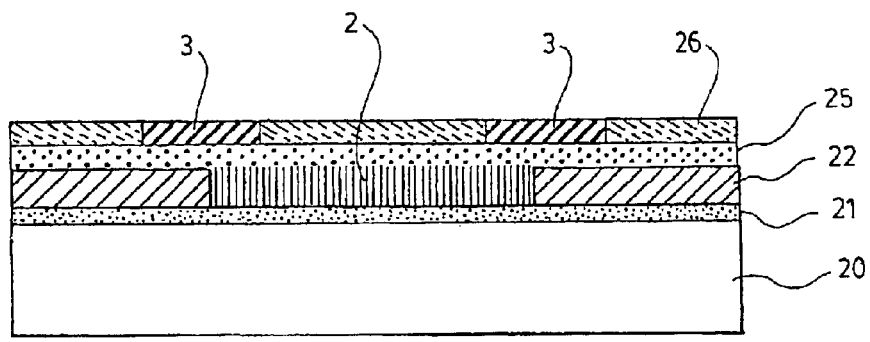

FIG. 4D shows electroforming of the hinge members 3 which may have the same specifications as the hinge members 3 described with reference to FIG. 3F.

Figure 4E:
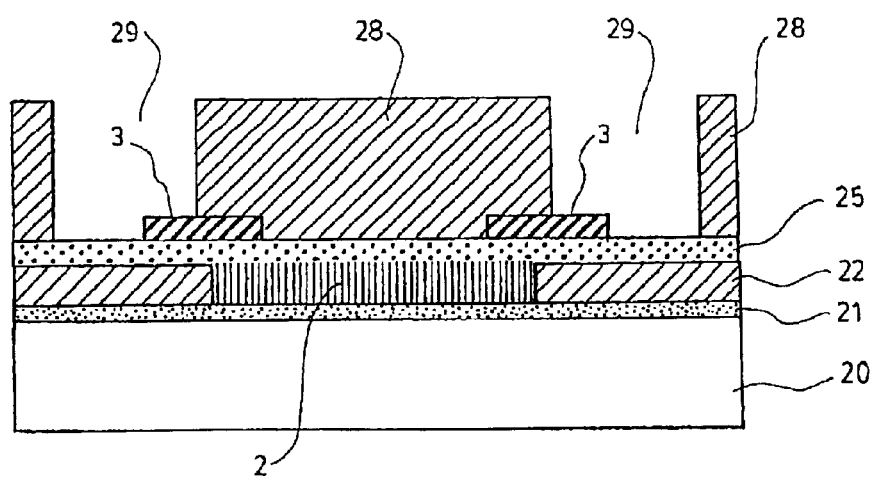

FIG. 4E shows the removal of the second photoresist layer 26 by the wet stripping or oxygen plasma ashing as well as deposition and patterning of the third photoresist layer 28. The openings 29 in this third photoresist layer 28 will define the shape of the support members 4.

Figure 4F:
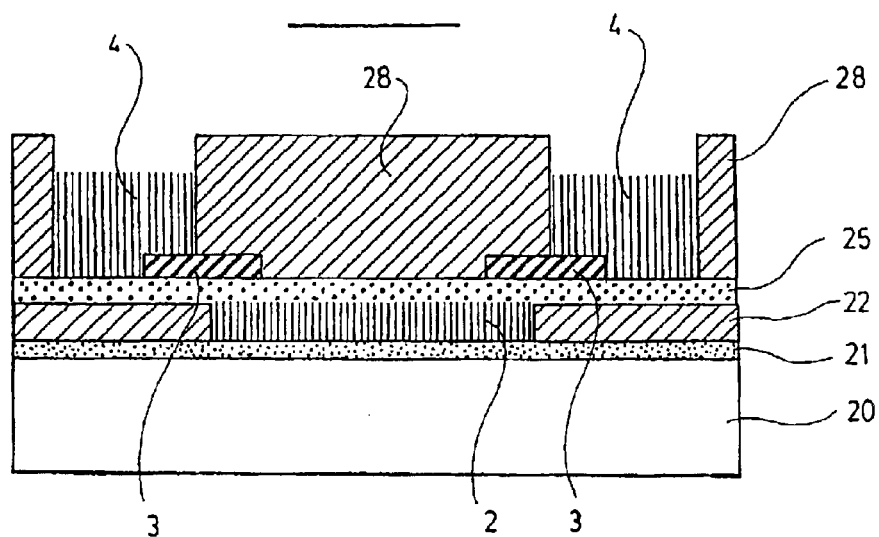

FIG. 4F shows the step of electroforming of the support members 4. The support members 4 are not completely filling the openings 29 in the third photoresist layer 28 thus permitting a subsequent selective electroforming of other materials. The support members 4 may have the same specifications as the support members 4 described with reference to FIG. 3D. If the fabricated microplatform 2 thickness can be kept significantly below 10 μm, forming of the second seed layer 25 would not be necessary. In this case, the first photoresist layer 22 could be removed after the electroforming of the microplatform 2, then the photolithographic steps as well as the electroforming steps for manufacturing of the hinge members 3 and then the support members 4 could be performed using the first seed layer 21. For thick microplatforms 2, a non-uniform distribution of spinned photoresist could appear if the planarizing first photoresist layer 22 is removed.

Figure 4G:
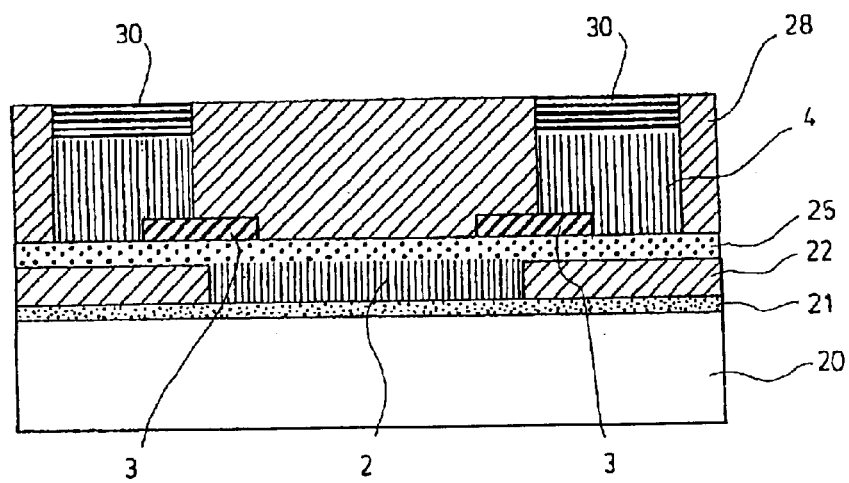

FIG. 4G shows the selective electroforming of the soldering material 30 such as PbSn alloys or In the openings 29 thus completely filling these openings 29. This soldering material 30 will be used for a permanent attachment of the microdevice 1 to its permanent substrate 5. For tin-lead solder electroplating, commercial methane sulfonic acid bath chemistries are preferred due to their enhanced stability, high deposition rate, lower cost and environmental compatibility. Other commercial lead-free tin based plating chemistries such as those used in wafer bump plating can also be employed. Typical applied currents, bath temperatures and pH levels for eutectic Pb37% Sn63% are in the range 5–12 Adm$^{-2}$, 30–50° C. and less than 2 respectively. Indium solder plating is best performed from an indium sulfamate bath. Typical applied currents, bath temperatures and pH are in the range 1–5 Adm$^{-2}$, 20–25° C. and 1.5–2 respectively.

Figure 4H:
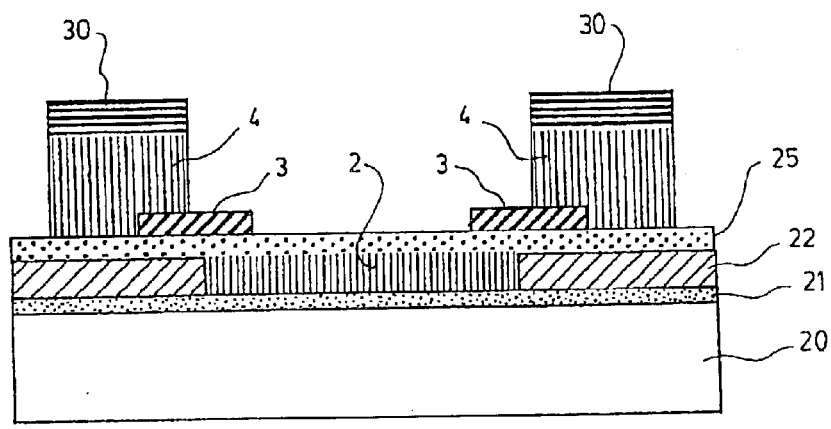

FIG. 4H shows the removal of the third photoresist layer 28 by the wet stripping or oxygen plasma ashing down to the second seed layer 25.

Figure 4I:
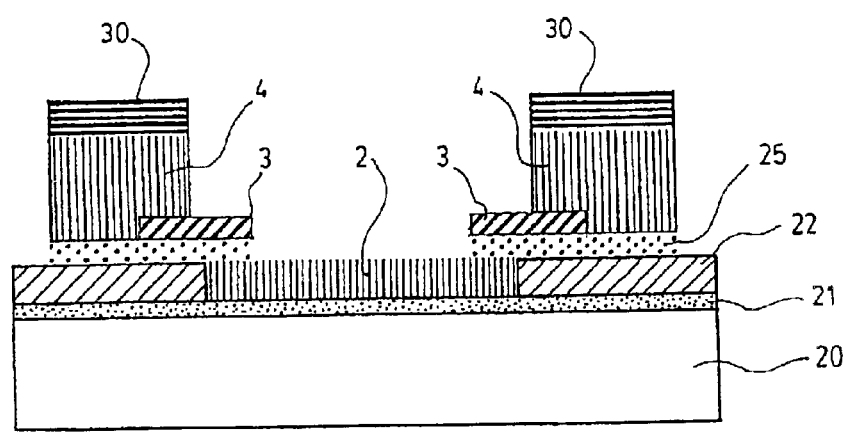

FIG. 4I shows the selective partial removal of the second seed layer 25 not protected by the support members 4 and the hinge members 3 materials.

Figure 4J:
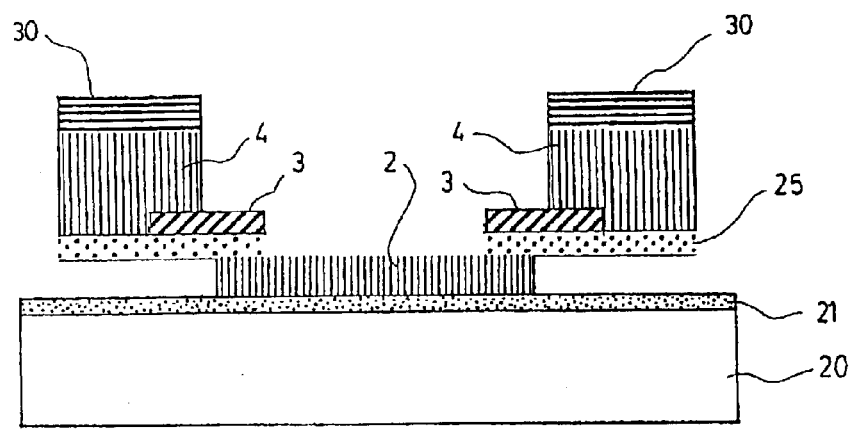

FIG. 4J shows the removal of the first photoresist layer 22 by the wet stripping or oxygen plasma ashing techniques.

Figure 4K:
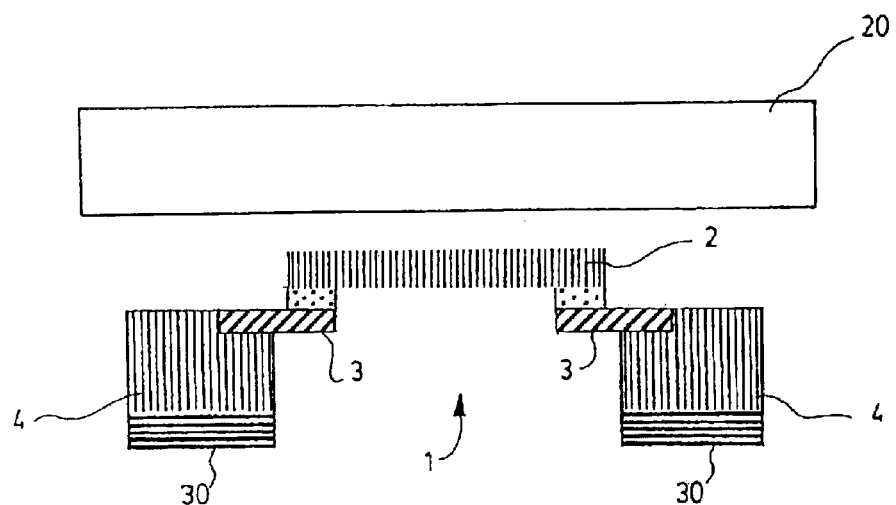

FIG. 4K shows the separation by wet etching of the microdevice 1 from the sacrificial substrate 20. This separation is achieved by removal by wet etching of the first seed layer 21. At the same time the residue of the second seed layer 25 now exposed is also removed in the same etching solution. This precludes that the etching solution used is attacking both the second seed layer 25 and the first seed layer 21 but not attacking other materials present.

Figure 4L:
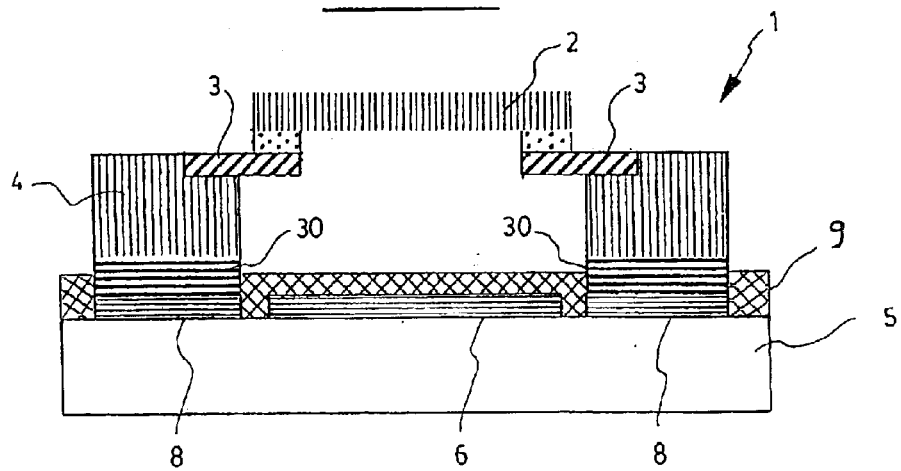

FIG. 4L shows the final step of attaching the freestanding partial microdevice to the permanent substrate 5 by making use, for example, of the soldering material 30. The soldering material 30 is subjected to a reflow and then brought in thermal and mechanical contact with the contact and soldering pads 8 of the substrate 5 covered with the protective layer 9. Surface tension of the molten soldering material 30 during the soldering of the partial microdevice to the substrate 5 will help to align the support members 4 with respect to the contact pads 8 of the substrate 5. Other methods for attachment of the microdevice 1 to the permanent substrate 5 can also be used including gluing or thermal bonding.

There is a possibility that the separation step illustrated in FIG. 4K can be performed after completion of the attachment step shown in FIG. 4L. This may be quite suitable especially in the case when individual miniature devices or partial microdevices are being manipulated in order to perform their attachment to the permanent substrate 5. This may not be the case when a large array of partial microdevices having a form of a substantial freestanding pellicle is being manipulated for attachment.

As mentioned above, the microdevices 1 that are formed according to the process of the present invention can provide mechanically solid support members 4 and microplatforms 2, with thicknesses up to tens and even hundreds of micrometers. These microdevices 1, when compared to the prior art devices, have improved mechanical strength, rigidity, low deformation, and high planarity. This provides a unique opportunity for forming microdevices 1 with microplatforms 2 with lateral dimensions of hundreds or even thousands of micrometers and a wide range of tilt angles (up to 90°) and displacements (several micrometers). Moreover, the proposed forming processes make possible the manufacturing of microdevices 1 being integrated parts of semiconductor substrates equipped with integrated electronic circuits or microdevices which can be in a hybrid fashion attached via soldering, gluing etc. to other substrates made of glass, ceramic or semiconductor. This offers an enormous flexibility in designing functional devices optimized for particular applications and operational environment.

Although preferred embodiments of the present invention have been described in the context of manufacturing a single microdevice equipped with a movable microplatform, the same embodiments can be applied to manufacturing in a single process of arrays of several microdevices at the same time. Moreover, it is to be understood that the invention described in detail herein and illustrated in the accompanying drawings is not limited to these precise embodiments and that various changes and modifications may be effected therein without departing from the scope or spirit of the present invention.

What is claimed is:

1. A process for making a microdevice (1), comprising the steps of:
   a) providing a base member;
   b) selectively electroforming at least one support member (4) for supporting a microplatform (2) with respect to the base member;
   c) selectively electroforming the microplatform (2); and
   d) forming at least one flexible hinge member (3) for hingedly connecting the microplatform (2) to said at least one support member (4) and allowing relative movement of the microplatform (2) with respect to said at least one support member (4);

wherein:

step b) comprises the step of mountably connecting said at least one support member (4) to the base member;

step d) is performed after step b) and before step c) and comprises the step of mountably connecting said at least one hinge member (3) to said at least one support member (4);

step c) comprises the step of mountably connecting the microplatform (2) to said at least one hinge member (3);

step d) comprises the step of selectively electroforming said at least one hinge member on said at least one support member (4);

step a) comprises the steps of:
   i) providing a substrate (5);
   ii) connecting at least one electrode (6) and at least one contact pad (8) onto a side of the substrate (5);
   iii) covering said side with a protective layer (9); and
   iv) providing at least one opening (10) in the protective layer (9) for accessing said at least one contact pad (8), thereby providing the base member;

step b) comprises the steps of:
   v) covering, after step iv), said side with a first seed layer (11);
   vi) covering, after step v), said side with a first photoresist layer (12); and
   vii) photolithographically patterning the first photoresist layer (12) to produce at least one opening (13) on the first photoresist layer (12) that is aligned with said at least one opening (10) for accessing said at least one contact pad (8), said at least one support member (4) being selectively electroformed in said at least one opening (13) of the first photoresist layer (12); and step d) comprises the steps of:
   viii) covering, after step vii), said side with a second seed layer (14);

ix) covering the second seed layer (14) with a second photoresist layer (15); and x) photolithographically patterning the second photoresist layer (15) to produce at least one opening (16) on the second photoresist layer (15) that is aligned with said at least one support member (4), said at least one hinge member (3) being selectively electroformed in said at least one opening (16) of the second photoresist layer (15).

2. The process for making the microdevice (1) according to claim 1, wherein step c) comprises the steps of:

xi) removing, after step x), the second photoresist layer (15);

xii) covering, after step xi), said side with a third photoresist layer (17);

xiii) photolitographically patterning the third photoresist layer (17) to produce an opening (18) on the third photoresist layer (17), the microplatform (2) being selectively electroformed in the opening (18) of the third photoresist layer (17);

xiv) removing, after step xiii), the third photoresist layer (17);

xv) selectively removing, after step xiv), a part of the second seed layer (14) that is unprotected by said at least one hinge member (3);

xvi) removing, after step xv), the first photoresist layer (12); and xvii) removing, after step xvi), the first seed layer (11) and another part of the second seed layer (14) unprotected by said at least one support member (4) for defining a cavity (7) between the microplatform (2) and the base member.

3. The process for making the microdevice (1) according to claim 2, wherein step c) further comprises the step of polishing an upper surface (19) of the microplatform (2) after step xiii).

4. The A process for making a microdevice (1) comprising the steps of:

a) providing a base member;

b) selectively electroforming at least one support member (4) for supporting a microplatform (2) with respect to the base member;

c) selectively electroforming the microplatform (2); and d) forming at least one flexible hinge member (3) for hingedly connecting the microplatform (2) to said at least one support member (4) and allowing relative movement of the microplatform (2) with respect to said at least one support member (4);

wherein;

step c) is performed before steps b) and d) and comprises the step of selectively electroforming the microplatform (2) on a sacrificial substrate (20);

step d) is performed before step b) and comprises the step of mountably connecting said at least one hinge member (3) to the microplatform (2);

step b) comprises the steps of mountably connecting said at least one support member (4) to said at least one hinge member (3), and removing the sacrificial substrate (20);

step a) comprises the step of mountably connecting said at least one support member (4) to the base member, after the step of removing the sacrificial substrate (20); and step c) comprises the steps of:

i) covering a side of the sacrificial substrate (20) with a first seed layer (21);

ii) covering the first seed layer (21) with a first photoresist layer (22); and iii) photolitographically patterning the first photoresist layer (22) to produce an opening (23) on the first photoresist layer (22), the microplatform (2) being selectively electroformed in the opening (23) of the first photoresist layer (22).

5. The process for making the microdevice (1) according to claim 4, wherein step d) comprises the steps of:

iv) covering, after step iii), said side with a second seed layer (25);

v) covering, after step iv), said side with a second photoresist layer (26);

vi) photolitographically patterning the second photoresist layer (26) to produce at least one opening (27) on the second photoresist layer (26) that is aligned with the microplatform (2); and vii) selectively electroforming said at least one hinge member (3) in said at least one opening (27) of the second photoresist layer (26).

6. The process for making the microdevice (1) according to claim 5, wherein step b) comprises the steps of:

viii) removing, after step vii), the second photoresist layer (26);

ix) covering, after step viii), said side with a third photoresist layer (28);

x) photolithographically patterning the third photoresist layer (28) to produce at least one opening (29) on the third photoresist layer (28), said at least one support member (4) being selectively electroformed in said at least one opening (29) of the third photoresist layer (28);

xi) selectively electroforming, after step x), a soldering material (30) on said at least one support member (4);

xii) removing, after step xi), the third photoresist layer (28);

xiii) removing, after step xii), a part of the second seed layer (25) unprotected by said at least one support member (4) and hinge member (3);

xiv) removing, after step xiii), the first photoresist layer (22); and xv) removing, after step xiv), the first seed layer (21) for separating the sacrificial substrate (20) from the microplatform (2).

7. The process for making the microdevice (1) according to claim 6, wherein step a) comprises the steps of:

xvi) providing a substrate (5) after step xv);

xvii) connecting, after step xvi), at least one electrode (6) and at least one contact pad (8) onto a side of the substrate (5);

xviii) covering the side of said substrate (5) with a protective layer (9);

xix) providing at least one opening (10) in the protective layer (9) for accessing said at least one contact pad (8), thereby providing the base member; and xx) soldering, after step xix), said at least one support member (4) onto the base member, via the soldering material (30) and said at least one contact pad (8).

8. A process for making a microdevice (1), comprising the steps of:

a) providing a base member;

b) selectively electroforming at least one support member (4) for supporting a microplatform (2) with respect to the base member;

c) selectively electroforming the microplatform (2); and d) forming at least one flexible hinge member (3) for hingedly connecting the microplatform (2) to said at least one support member (4) and allowing relative movement of the microplatform (2) with respect to said at least one support member (4);

wherein;

step b) is performed before steps c) and d) and comprises the step of selectively electroforming said at least one support member (4) on a sacrificial substrate (20);

step d) is performed before step c) and comprises the step of mountably connecting said at least one hinge member (3) to said at least one support member (4); step c) comprises the steps of mountably connecting the microplatform (2) to said at least one hinge member (3), and removing the sacrificial substrate (20);

step a) comprises the step of mountably connecting said at least one support member (4) to the base member, after the step of removing the sacrificial substrate (20); and step b) comprises the steps of:
i) covering a side of the sacrificial substrate (20) with a first seed layer (21);
ii) covering the first seed layer (21) with a first photoresist layer (22); and
iii) photolithographically patterning the first photoresist layer (22) to produce at least one opening (29) on the first photoresist layer (22), said at least one support member (4) being selectively electroformed in said at least one opening (29) of the first photoresist layer (22).

9. The process for making the microdevice (1) according to claim 8, wherein step iii) comprises the step of selectively electroforming a soldering material (30) on said at least one opening (29) before said at least one support member (4) is selectively electroformed therein.

10. The process for making the microdevice (1) according to claim 9, wherein step d) comprises the steps of:
iv) covering, after step iii), said side with a second seed layer (25);
v) covering, after step iv), said side with a second photoresist layer (26);
vi) photolithographically patterning the second photoresist layer (26) to produce at least one opening (27) on the second photoresist layer (26) that is aligned with said at least one support member (4); and
vii) selectively electroforming said at least one hinge member (3) in said at least one opening (27) of the second photoresist layer (26).

11. The process for making the microdevice (1) according to claim 10, wherein step c) comprises the steps of:
viii) removing, after step vii), the second photoresist layer (26);
ix) covering, after step viii), said side with a third photoresist layer (28);
x) photolithographically patterning the third photoresist layer (28) to produce an opening (23) on the third photoresist layer (28), the microplatform (2) being selectively electroformed in the opening (23) of the third photoresist layer (28);
xi) removing, after step x), the third photoresist layer (28);
xii) removing, after step xi), a part of the second seed layer (25) unprotected by said at least one support member (4) and hinge member (3);
xiii) removing, after step xii), the first photoresist layer (22); and xiv) removing, after step xiv), the first seed layer (21) for separating the sacrificial substrate (20) from the soldering material (30).

12. The process for making the microdevice (1) according to claim 11, wherein step a) comprises the steps of:
xv) providing a substrate (5);
xvi) connecting, after step xv), at least one electrode (6) and at least one contact pad (8) onto a side of the substrate (5);
xvii) covering the side of said substrate (5) with a protective layer (9);
xviii) providing at least one opening (10) in the protective layer (9) for accessing said at least one contact pad (8), thereby providing the base member, and
xix) soldering, after step xviii), said at least one support member (4) onto the base member, via the soldering material (30) and said at least one contact pad (8).

13. A process for making a microdevice (1), comprising the steps of:
a) providing a base member;
b) selectively electroforming at least one support member (4) for supporting a microplatform (2) with respect to the base member;
c) selectively electroforming the microplatform (2); and
d) forming at least one flexible hinge member (3) for hingedly connecting the microplatform (2) to said at least one support member (4) and allowing relative movement of the microplatform (2) with respect to said at least one support member (4);

wherein;

step d) is performed before step c) and comprises the step of selectively electroforming said at least one hinge member (3) on a sacrificial substrate (20);

step c) comprises the steps of mountably connecting the microplatform (2) to said at least one hinge member (3) and removing the sacrificial substrate (20);

step b) is performed after step a) and comprises the steps of mountably connecting said at least one support member (4) to the base member; and step d) comprises the steps of:
i) covering a side of the sacrificial substrate (20) with a first seed layer (21);
ii) covering the first seed layer (21) with a first photoresist layer (22); and
iii) photolithographically patterning the first photoresist layer (22) to produce at least one opening (27) on the first photoresist layer (22), said at least one hinge member (3) being selectively electroformed in said at least one opening (27) of the first photoresist layer (22).

14. The process for making the microdevice (1) according to claim 13, wherein step iii) comprises the step of selectively electroforming a soldering material (30) on said at least one opening (27) before said at least one hinge member (3) is selectively electroformed therein.

15. The process for making the microdevice (1) according to claim 14, wherein step c) comprises the steps of:
iv) covering, after step iii), said side with a second seed layer (25);
v) covering, after step iv), said side with a second photoresist layer (26);
vi) photolithographically patterning the second photoresist layer (26) to produce an opening (23) on the second photoresist layer (26) that is aligned with said at least one hinge member (3);

vii) selectively electroforming the microplatform (2) in the opening (23) of the second photoresist layer (26);

viii) removing, after step vii), the second photoresist layer (26);

ix) removing, after step viii), a part of the second seed layer (25) unprotected by the microplatform (2);

x) removing, alter step ix), the first photoresist layer (22); and xi) removing, after step x), the first seed layer (21) for separating the sacrificial substrate (20) from the soldering material (30).

16. The process for making the microdevice (1) according to claim 15, wherein:

step a) comprises the steps of:
 xii) providing a substrate (5);
 xiii) connecting, after step xii), at least one electrode (6) and at least one contact pad (8) onto a side of the substrate (5);
 xiv) covering the side of said substrate (5) with a protective layer (9); and
 xv) providing at least one opening (10) in the protective layer (9) for accessing said at least one contact pad (8), thereby providing a base member; and step b) comprises the steps of:
 xvi) covering, after step xv), said side with a third seed layer (11);
 xvii) covering, after step v), said side with a third photoresist layer (12);
 xviii) photolithographically patterning the third photoresist layer (12) to produce at least one opening (13) on the third photoresist layer (12) that is aligned with said at least one opening (10) for accessing said at least one contact pad (8), said at least one support member (4) being selectively electroformed in said at least one opening (13) of the third photoresist layer (12);
 xix) removing, after step xviii), the third photoresist layer (12);
 xx) selectively removing, after step xix), a part of the third seed layer (11) unprotected by said at least one support member (4); and
 xxi) soldering, after step xx), said at least one hinge member (3) onto said at least one support member (4), via the soldering material (30).

17. The process for making the microdevice (1) according to claim 13, wherein step b) comprises the step of selectively electroforming a soldering material (30) on said at least one support member (4).

18. The process for making the microdevice (1) according to claim 17, wherein step c) comprises the steps of:

iv) covering, after step iii), said side with a second seed layer (25);

v) covering, after step iv), said side with a second photoresist layer (26);

vi) photolithographically patterning the second photoresist layer (26) to produce an opening (23) on the second photoresist layer (26) that is aligned with said at least one hinge member (3);

vii) selectively electroforming the microplatform (2) in the opening (23) of the second photoresist layer (26);

viii) removing, after step vii), the second photoresist layer (26);

ix) removing, after step viii), a part of the second seed layer (25) unprotected by the microplatform (2);

x) removing, after step ix), the first photoresist layer (22); and xi) removing, after step x), the first seed layer (21) for separating the sacrificial substrate (20) from the soldering material (30).

19. The process for making the microdevice (1) according to claim 18, wherein:

step a) comprises the steps of:
 xii) providing a substrate (5);
 xiii) connecting, after step xii), at least one electrode (6) and at least one contact pad (8) onto a side of the substrate (5);
 xiv) covering the side of said substrate (5) with a protective layer (9); and
 xv) providing at least one opening (10) in the protective layer (9) for accessing said at least one contact pad (8), thereby providing the base member; and step b) comprises the steps of:
 xvi) covering, after step xv), said side with a third seed layer (11);
 xvii) covering, after step v), said side with a third photoresist layer (12);
 xviii) photolithographically patterning the third photoresist layer (12) to produce at least one opening (13) on the third photoresist layer (12) that is aligned with said at least one opening (10) for accessing said at least one contact pad (8), said at least one support member (4) being selectively electroformed in said at least one opening (13) of the third photoresist layer (12);
 xix) removing, after step xviii), the third photoresist layer (12);
 xx) selectively removing, after step xix), a part of the third seed layer (11) unprotected by said at least one support member (4); and
 xxi) soldering, after step xx), said at least one hinge member (3) onto said at least one support member (4), via the soldering material (30).

20. A process for making a microdevice (1), comprising the steps of:

a) providing a base member;

b) selectively electroforming at least one support member (4) for supporting a microplatform (2) with respect to the base member;

c) selectively electroforming the microplatform (2); and d) forming at least one flexible hinge member (3) for hingedly connecting the microplatform (2) to said at least one support member (4) and allowing relative movement of the microplatform (2) with respect to said at least one support member (4);

wherein;

step d) is performed before step c) and comprises the step of selectively electroforming said at least one hinge member (3) on a sacrificial substrate (20);

step c) comprises the steps of mountably connecting the microplatform (2) to said at least one hinge member (3);

step b) is performed after step c) and comprises the steps of mountably connecting said at least one support member (4) to said at least one hinge member (3) and microplatform (2), and removing the sacrificial substrate (20);

step a) is performed after step b) and comprises the step of mountably connecting said at least one support member (4) to the base member; and step d) comprises the steps of:
 i) covering a side of the sacrificial substrate (20) with a first seed layer (21);

ii) covering the first seed layer (21) with a first photoresist layer (22); and iii) photolithographically patterning the first photoresist layer (22) to produce at least one opening (27) on the first photoresist layer (22), said at least one hinge member (3) being selectively electroformed in said at least one opening (27) of the first photoresist layer (22).

21. The process for making the microdevice (1) according to claim 20, wherein step c) comprises the steps of:

iv) removing, after step iii), the first photoresist layer (22);

v) covering, after step iv), said at least one hinge member (3) with a second photoresist layer (26);

vi) photolithographically patterning the second photoresist layer (26) to produce an opening (23) on the second photoresist layer (26) that is aligned with said at least one hinge member (3); and vii) selectively electroforming the microplatform (2) in the opening (23) of the second photoresist layer (26).

22. The process for making the microdevice (1) according to claim 20, wherein step b) comprises the step of selectively electroforming a soldering material (30) on said at least one support member (4), before the step of mountably connecting said at least one support member (4) to the base member.

23. The process for making the microdevice (1) according to claim 22, wherein step b) comprises the steps of:

viii) removing, after step vii), the second photoresist layer (26);

ix) covering, after step viii), said microplatform (2) with a third photoresist layer (28);

x) photolithographically patterning the third photoresist layer (28) to produce at least one opening (29) on the third photoresist layer (28) that is aligned with said microplatform (2), said at least one support member (4) being selectively electroformed in said at least one opening (29) of the third photoresist layer (28);

xi) removing, after step x), the third photoresist layer (28);

xii) removing, after step xi), the first seed layer (21) for separating the sacrificial substrate (20) from said at least one hinge member (3); and xiii) soldering, after step xii), said at least one support member (4) onto said base member via the soldering material (30).

24. The process for making the microdevice (1) according to claim 23, wherein step a) comprises the steps of:

xiv) providing a substrate (5);

xv) connecting, after step xiv), at least one electrode (6) and at least one contact pad (8) onto a side of the substrate (5);

xvi) covering the side of said substrate (5) with a protective layer (9); and xvii) providing at least one opening (10) in the protective layer (9) for accessing said at least one contact pad (8), thereby providing the base member.

\* \* \* \* \*